US006498544B1

United States Patent
Yung (10) Patent No.: US 6,498,544 B1
(45) Date of Patent: Dec. 24, 2002

(54) METHOD AND APPARATUS FOR IMPROVING THE ACCURACY OF A PHASE SHIFTER

(75) Inventor: Ming Lai Yung, Los Altos, CA (US)

(73) Assignee: Precision Microwave, Inc., Santa Clara, CA (US)

( * ) Notice: Subject to any disclaimer, the term of this patent is extended or adjusted under 35 U.S.C. 154(b) by 0 days.

(21) Appl. No.: 09/823,609

(22) Filed: Mar. 30, 2001

(51) Int. Cl.[7] .................................. H03H 11/16
(52) U.S. Cl. ........................ 333/138; 333/164
(58) Field of Search .................. 333/138, 163, 333/161, 164, 170, 24.1

(56) References Cited

U.S. PATENT DOCUMENTS 4,405,907 A * 9/1983 Breese et al. .............. 333/24.1
4,931,753 A * 6/1990 Nelson et al. .............. 333/161

* cited by examiner

Primary Examiner—Robert Pascal
Assistant Examiner—Dean Takaoka
(74) Attorney, Agent, or Firm—Robert K. Tendler (57) ABSTRACT

An improved accuracy phase shifter having cascaded phase shifting modules is provided for phase shifting a pulse train which rather than utilizing two pairs of control voltage leads for each phase shifting module, utilizes only one pair to significantly reduce the electromagnetic interference between the cascaded phase shifting modules. The result is that the phase of an incoming pulse train can be shifted from 0 to 360° in 3° increments with +/−1° accuracy. When the subject phase shifter is utilized in long haul fiber-optic cable networks operating at 10 gigabits/sec. for correcting phase offsets of data streams transmitted over ultra long distances, the utilization of the subject phase shifter plays a part in obviating the necessity of having regeneration units every 70 to 100 miles, thus permitting error-free transmission over as many as 2500 miles without the requirement for regeneration.

4 Claims, 8 Drawing Sheets

METHOD AND APPARATUS FOR IMPROVING THE ACCURACY OF A PHASE SHIFTER

FIELD OF INVENTION

This invention relates to phase shifting and more particularly to a precision phase shifter having improved accuracy and reduction of complexity.

BACKGROUND OF THE INVENTION

Note: Applies to fiber optic networks or any broadband, high data rate communication. In fiber optic cable networks, or indeed in any broadband high data rate communications system, there is a requirement to regenerate or amplify the signals along a cable path so as to provide robust communication from a head-end system to a destination or receiver. With transmission rates presently exceeding 10 gigabits/sec., loss of timing results in lost data or degration of data integrity when the pulse trains are transmitted over long distances. In such a high data rate system the behavior of electric circuits is quite similar to microwave circuits operating in the 5 GHz range. Thus, part of the loss of data can be viewed as the result of a phase shift between a data pulse train and a clock pulse train due to the dispersion which occurs in fiber optic cables over long distances. Loss of data can also be due to loss of signal amplitude over the distance and degradation of the signal shape such as broadening of the signal pulse due to dispersion inside the optical cables.

The problem involved in the transmission of data streams over long distances is thus the fact that the data streams themselves degrade such that not only is the amplitude of the signals reduced with distance, the waveforms which are originally squared up become degraded. As a result, in some instances the degraded pulse trains cannot be appropriately sampled, retrieved and recovered due to a phase offset in the timing between timing pulses sent at the same time as the data stream.

In the past, the degradation due to dispersion and other artifacts was such that regeneration units needed to be dispersed along the transmission line every 70 to 100 miles. The reason that the regeneration units were necessary was to shape up the pulses that had degraded and to realign them with respect to a timing reference. It will however be appreciated that regeneration units are expensive and in general require an optical filter, a photo detector and an amplifier along with a data-recovery system which after the pulses are squared up are adjusted in time to realign them with a recovered clock signal. Regeneration usually requires converting the optical signals back to electronic, then amplifying and re-shaping, and then converting them into optical signals again. While some regeneration uses all-optics amplifiers without converting into electronic signals and back, there is still the need for electric power to operate the regeneration systems.

In the past, one method of recovering the data involved shifting the entire data stream either forward or backward so that the phase delay between the clock stream and the data stream could be adjusted by the operator for the entire system or in some cases reduced to zero. Note that the amount of shift can be under operator control to achieve desired alignment between data and clock pulse. This was accomplished by dialing in a particular phase shift to shift the data pulse train such that the leading or trailing edges of the clock and data pulses would be aligned.

Phase shift, as used herein, refers to the offset between either leading or trailing edges of a clock pulse and those of the data pulse train.

In order to shift the pulse train by for instance a full 360°, it was a practice to serially connect or cascade a number of phase shifting modules, that incrementally phase shifted the input signal as it passed through the various phase shifting modules. The desideratum was to be able to exercise phase shift control to one degree of resolution over the entire 360°.

This required a large number of phase shifting units of different phase shift angles whose combinations could give any angle between zero and 360°. However, when phase shift modules were serially connected together in a reasonable package, cross talk between the phase-shifting modules, particularly among the control wires to the modules resulted in a practical limit of phase shift resolution to about 12°+/−3° for a bit rate of nominally 10 gigabit/sec, or frequency around 5 GHz.

It will be appreciated that a 12° phase shift is unacceptable in terms of the precision by which the pulse train needed to be shifted with respect to the clock pulse train, and as such, resulted in the inability to eliminate the costly regeneration units.

As will be seen, key to the subject invention is the recognition that the cause of the phase shift errors is the many pairs of control wires to the phase shifting modules inside a compact container, which cause electromagnetic interference with one another in an unpredictable manner. Note that the control wires carry electric voltages that either activate or de-activate a particular phase shifting module. The use of the multiple pairs of control was led to the realization that with the presently available phase shifting modules, it would be impossible to reliably control phase shifting to the accuracy required for eliminating the regeneration units in for instance a fiber optic cable system stretching for 2500 miles.

Secondly, in the prior art, two voltages on 2 pairs of control wires were utilized for the phase shifting modules to switch in and out two different electrical paths of differing length. In these phase shifters it was found that the two voltages must switch in perfect sync in order for the phase shifts to be reliably produced.

In point of fact, however, the two control voltages have different voltage rise and fall times which are the result of the internal capacitance of the circuit, such that by utilizing the two voltages and having any mismatch in the rise and fall times, phase shift errors occurred due to mismatch in the transitions in the two voltages.

While it will be noted that dimensional changes of connectors and circuit elements inside the entire phase shifter unit due to temperature changes result in systematic errors which can be characterized by testing and therefore can be compensated, cross talk between the many pairs of control wires results in random errors that cannot be systematically compensated, thus, still presenting a problem.

The result of the inability to control the phase shift resolution to only 12° at 5 GHz prevented long haul fiber optic cable plants from eliminating the number of regenerators required. The inability to shift the received data pulse trains to the required accuracy thus severely limited the ability to provide a cost-effective high-speed fiber optic network.

SUMMARY OF THE INVENTION

It has now been found that in a fiber optic transmission system having a 10-gigabit/sec bit rate a 3°+/−1° resolution is achievable using binary combinations of control voltages in which only one voltage and only one pair of control wires is utilized for the individual phase shifting modules of the phase shifter over the entire range of 360°. It has been found with the subject techniques that each of the phase shifting modules of seven different angles, namely 180°, 90°, 45°, 22.5°, 11.25°, 6° and 3°, can achieve a phase shift of any multiple of 3° with an accuracy of +/−1°. What this accuracy means is that a number of regeneration units can be eliminated. In one embodiment, pulse trains were recovered when transmitted over 2500 miles without regeneration along the way. Note that in one embodiment a 180° phase shift is achieved by cascading two 90° phase shift modules.

As mentioned above, this accuracy is achieved through the utilization of only one control voltage, which requires only one pair of wires for each module. The result is that the subject systems succeed in reducing the number of control wires by 50%, and consequently the amount of interference among the seven phase shifting modules inside the phase shifter. Additionally, there is no unwanted error due to the transitioning of the control voltage because there is only one control voltage utilized, versus two in the traditional design.

In one embodiment the phase shifting modules utilize PIN diodes as switching devices to reroute the microwave clock and data streams, which fall under microwave frequency regime, to change its propagation length and therefore its propagation delay and phase. In a preferred embodiment, a single control line is utilized to carry a bipolar control voltage to switch the signal state of the phase shifting module. For instance, a positive control voltage for one single phase state, and a negative signal control voltage for the other signal phase state causes the signals to go through one of two paths through the phase shifting module. For each signal path in the phase shifting element, there are two PIN diodes, a resistor and a capacitor, in its simplest form.

Thus, each phase shifting module comprises two signal paths of different length to provide a predetermined value or difference. The microwave input signal is switched between the two paths to obtain the desired phase shift.

In one embodiment for each phase shifting module there is one DC blocking capacitor for the input and one for the output, with the control voltage introduced through an RF choke in one end and returned to ground through another RF choke in the other end.

It will be appreciated that the PIN diodes can be completely turned on by forward-biasing with a forward current and turned off by reverse-biasing it.

The result is that a simplified physical arrangement is achieved for the control lines to an individual phase shifting module, which minimizes the interference of the DC control lines with respect to the phase shifting performance. Moreover, since the control voltage is switched from positive to negative in a single continuous sweep without complicated crossover control circuits, smooth phase shifting can be achieved. This is because there is only one rise and fall time for the control voltage. Since there is no interplay between the rise and fall times of two separate control voltages as was the case in prior art systems, timing and phase errors associated with the non-synchronized voltages are eliminated.

The result of cascading the phase shifting modules is that for an equivalent to a 5 GHz microwave system, a more precise ultimate phase shifting result is achieved. Being able to phase-adjust the data pulse train vis-á-vis the clock pulses in such a precise manner permits the removal of regeneration units normally thought to be required in long-haul fiber optic cable systems. Being able to adjust data pulse train vis-á-vis the clock pulses in such a precise manner in a 10 gigabit/sec system provides a key functional capability to "long haul" optical systems such that the distance between regeneration is now substantially increased. For instance, in a 2500 mile length of cable, it has been found that one needs only a preamplifier and squaring circuit at the receive end, followed by the ability to phase shift the recovered pulse train to a 3° accuracy which maintains acceptably low error rates in the data transmission.

In summary, an improved accuracy phase shifter having cascaded phase shifting modules is provided for phase shifting a pulse train which rather than utilizing two pairs of control voltage leads for each phase shifting module, utilizes only one pair to significantly reduce the interference between the cascaded phase shifting modules. The result is that the phase of an incoming pulse train can be shifted from 0 to 360° in 3° increments with +/−1° accuracy. When the subject phase shifter is utilized in fiber-optic cable networks operating at 10 gigabits/sec. for correcting phase offsets of data streams transmitted over ultra long distances, the utilization of the subject phase shifter plays a part in obviating the necessity of having regeneration units every 70 to 100 miles, thus permitting error-free transmission over as many as 2500 miles without the requirement for regeneration.

BRIEF DESCRIPTION OF THE DRAWINGS

These and other features of the subject invention will be better understood in connection with the Detailed Description in conjunction with the Drawings, of which.

DETAILED DESCRIPTION

Figure 1:
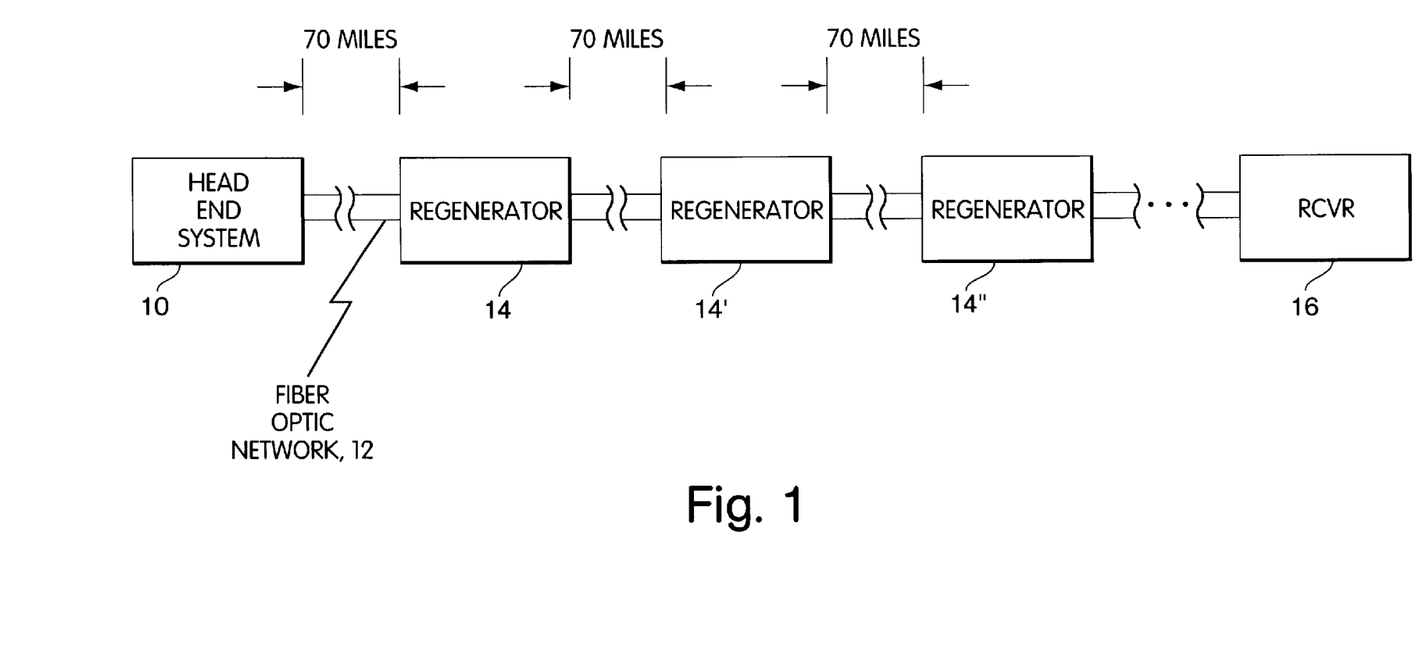
FIG. 1 is a block diagram of a fiber optic network in which a number of regeneration units are required in order to transmit data from a head-end system to a receiver over a long distance.

Referring now to FIG. 1, in a typical long haul fiber optic network a head-end system 10 transmits data over an optical fiber 12 to a regeneration unit 14, which amplifies the signal on its way to a distant receiver 16. The regeneration unit amplifies the optical signal and to a certain extent regenerates it so that anomalies, artifacts and dispersion along the fiber optic cable are eliminated. For some long haul applications a number of regeneration units, here illustrated at 14' and 14", are interposed along the length of the fiber optic cable in order to assure the robust receipt of the data from the head-end system.

As mentioned hereinbefore, 10 gigabit/sec. data rates are achievable over fiber optic links, but only if the received data streams are intact and correlatable with a simultaneously transmitted clock pulse train. Typically, the data stream is transmitted over a data fiber, whereas the clock pulse train is transmitted over a clock fiber.

Due to the degradation associated with the long path lengths it is necessary to space the regeneration units at 70–100 mile intervals along the cable in order to reestablish the correspondence between the data stream and the accompanying timing pulses. Regeneration at so frequent an interval oftentimes precludes the use of this type of high data-rate system for long haul applications and most especially those that are over 2000 miles in length. It is not that the data cannot be recovered at each regeneration unit, but rather the cost of the regeneration and the reliability of the regeneration in long-haul applications.

Figure 2:
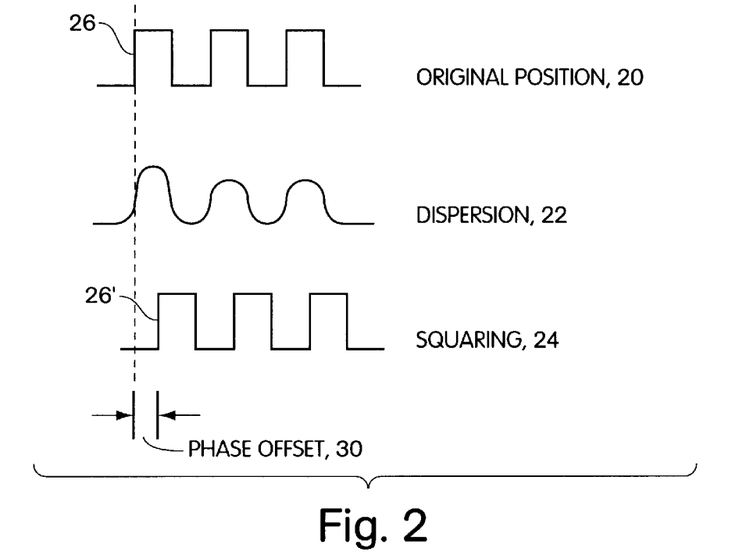
FIG. 2 is a waveform diagram illustrating an original pulse train, the effects of dispersion, the effects of squaring of the dispersed original pulse train and the resulting phase offset, which must be corrected for in order to recover the original pulse train.

As will be seen in FIG. 2, an original pulse train 20 has well-shaped pulses which are transmitted over the aforementioned data fiber. However, with distance, the original pulse trains are distorted as illustrated at 22, usually due to dispersion and other artifacts. As can be seen, a waveform in 22 has been distorted such that the leading and the trailing edges of the original pulses are now rounded. Upon squaring by a photo detector as illustrated 24 it may be that the original position of the leading edges 26 of the original pulse train will be displaced as illustrated by 26' such that a phase offset as illustrated at 30 occurs.

Since the data rate assumed is 10 gigabits/sec., and since this is equivalent to about 5 GHz in terms of microwave theory, then the phase offset can be described in terms of phase angles.

Figure 3:
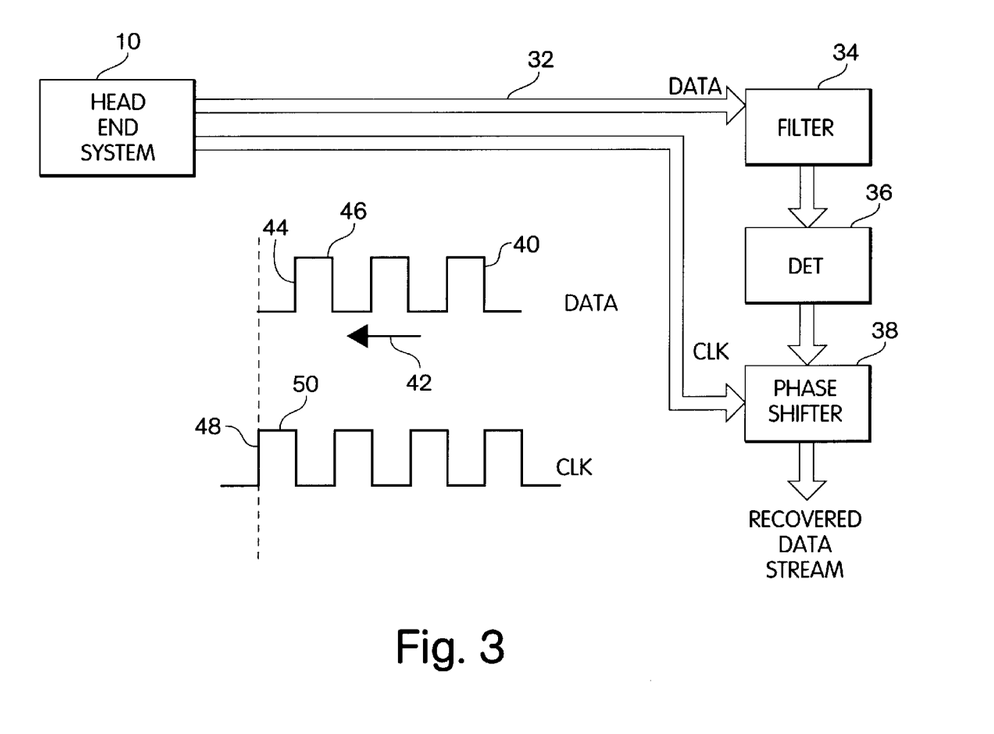
FIG. 3 is a block diagram illustrating the utilization of a phase shifter in order to correct for the phase offset of FIG. 2.

Referring now to FIG. 3, in a long-haul fiber optic application a data fiber 32 is coupled to a filter 34 at the receive end which is then coupled to a detector 36 and thence to a phase shifter 38.

It is the purpose of the phase shifter to shift the recovered data stream, here illustrated at 40, in the direction illustrated by arrow 42 such that the leading edge 44 of a pulse 46 is aligned with the leading edge 48 of a clock pulse 50.

It is therefore the purpose of phase shifter 38 to shift the incoming data stream in time to match the clock pulse stream so that the data can be appropriately recovered.

Figure 4:
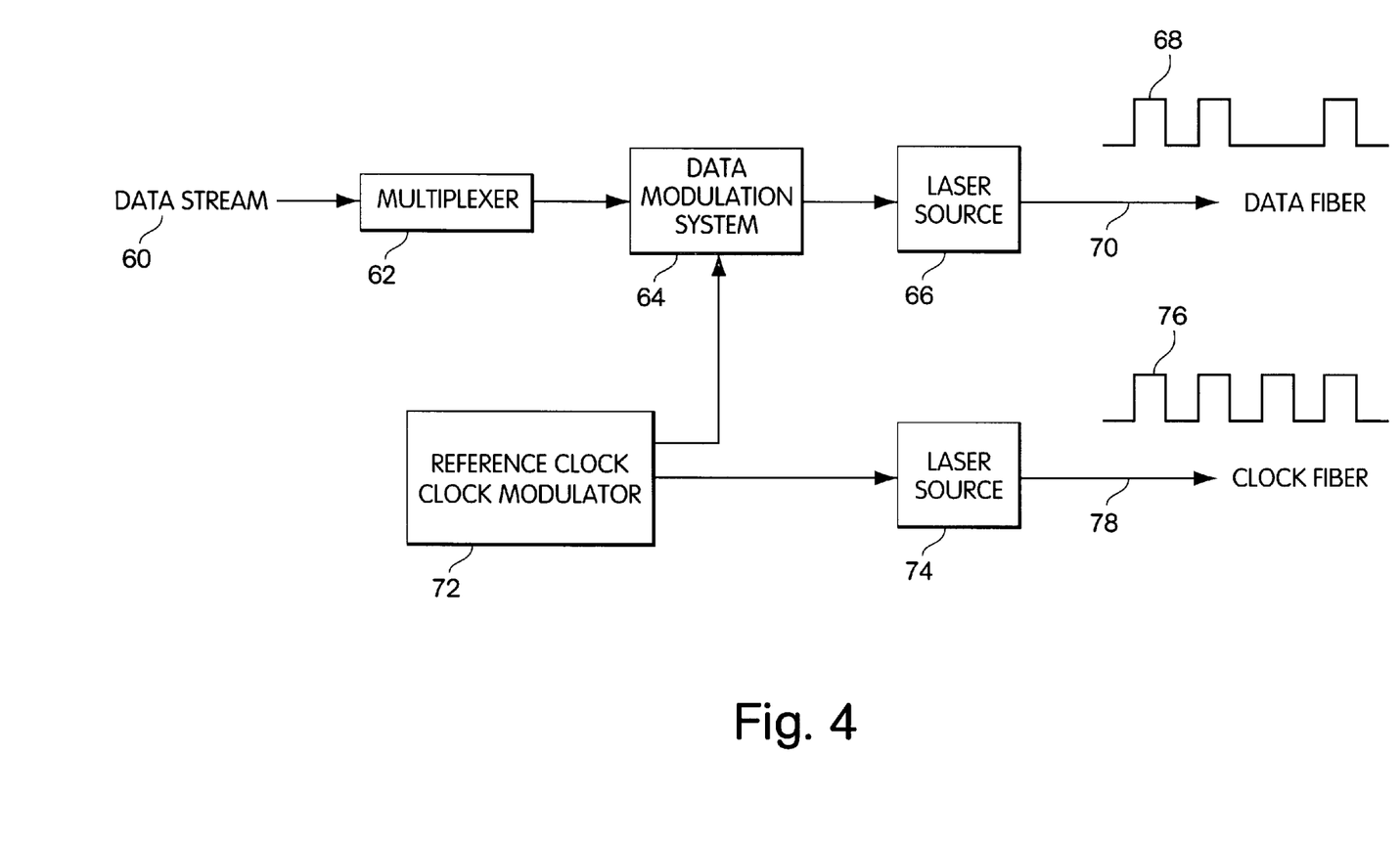
FIG. 4 is a block diagram of the transmit section of a fiber optic communication system in which a data stream is multiplexed and modulated and then applied to a laser source in synchronism with a reference clock modulator so that a pulse train is coupled to a data fiber and a clock train is coupled to a clock fiber.

One such system is illustrated in FIG. 4 in which an input data stream 60 is applied to a multiplexer 62 and thence to a data modulation system 64 coupled to a laser source 66 which outputs a pulse train 68 onto a data fiber 70. A reference clock modulator 72 is coupled to the data modulation system for the timing of the outgoing data pulses and also to a laser source 74 such that the output on clock is a pulse train 76 on clock fiber 78.

Figure 5:
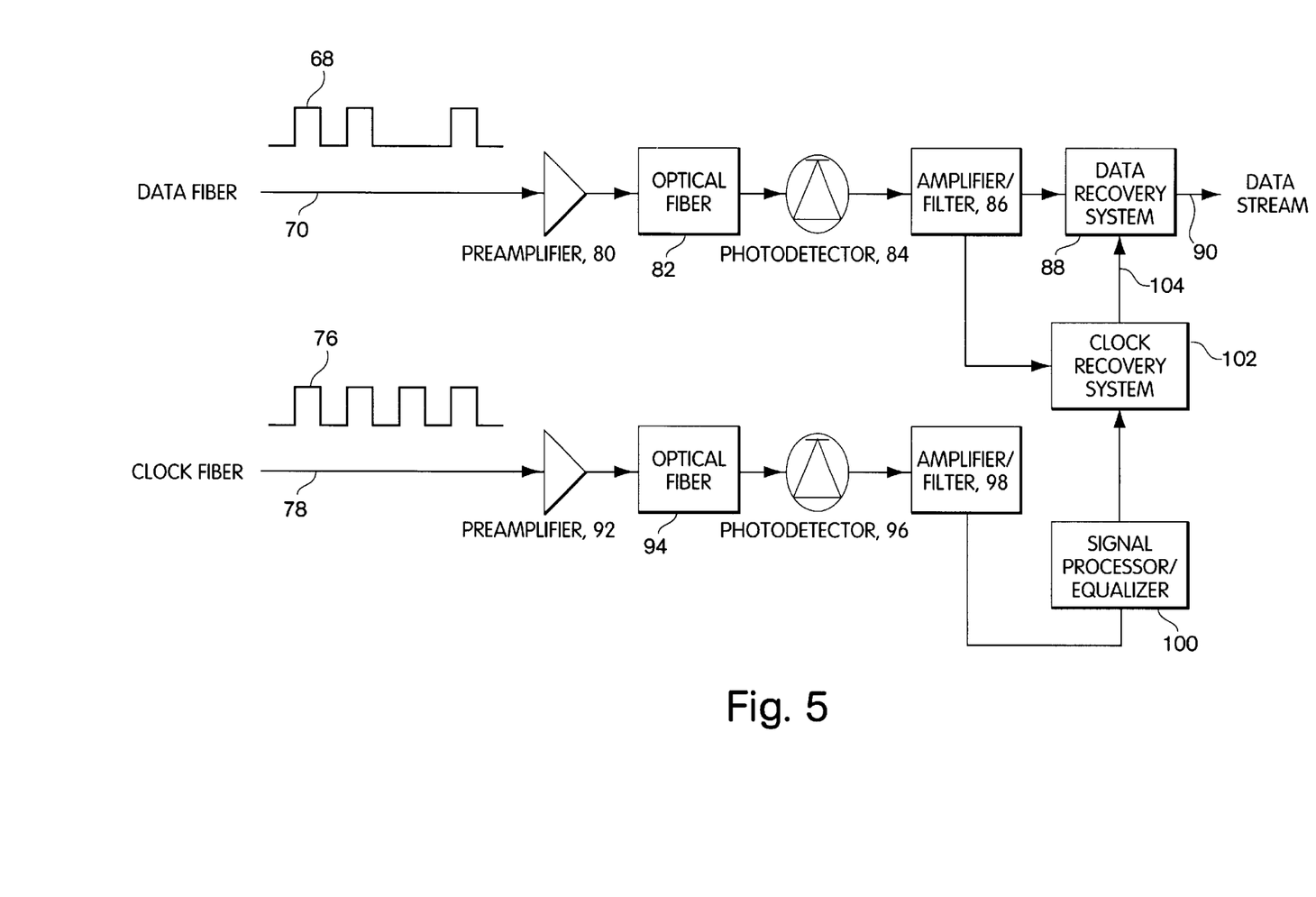
FIG. 5 is a block diagram showing the receipt of optical signals from the data fiber and clock fiber in FIG. 4 in which each of the pulse trains is preamplified, filtered and detected with a photo detector for squaring purposes, after which the detected signals are amplified, with the amplified pulse train on the data fiber being corrected in terms of timing with respect to the clock signal recovered at the receiver.

Referring now to FIG. 5, at the receive end data pulse train 68 is amplified by a preamplifier 80 which is in turn coupled to an optical filter 82 and thence to a photo detector 84 which is in turn coupled to an amplifier 86 that is coupled to a data recovery system 88 which outputs the recovered data stream as illustrated at 90. The clock pulse train 76 is likewise amplified by a preamplifier 92 and is coupled to its optical filter 94 and thence to the corresponding photo detector 96 where it is amplified at 98 and applied to a signal processor 100, which performs an equalizer function. The output of signal processor 100 is applied to a clock recovery system 102, which has two inputs. The first input is the output of amplifier 86 and also the output of signal processor 100. What is applied to the data recovery system 88 is a phase angle by which the incoming data stream is to be shifted in order to align the data pulse train with the recovered clock pulse train so that the data stream 90 will contain few errors and be as robust as possible.

Figure 6:
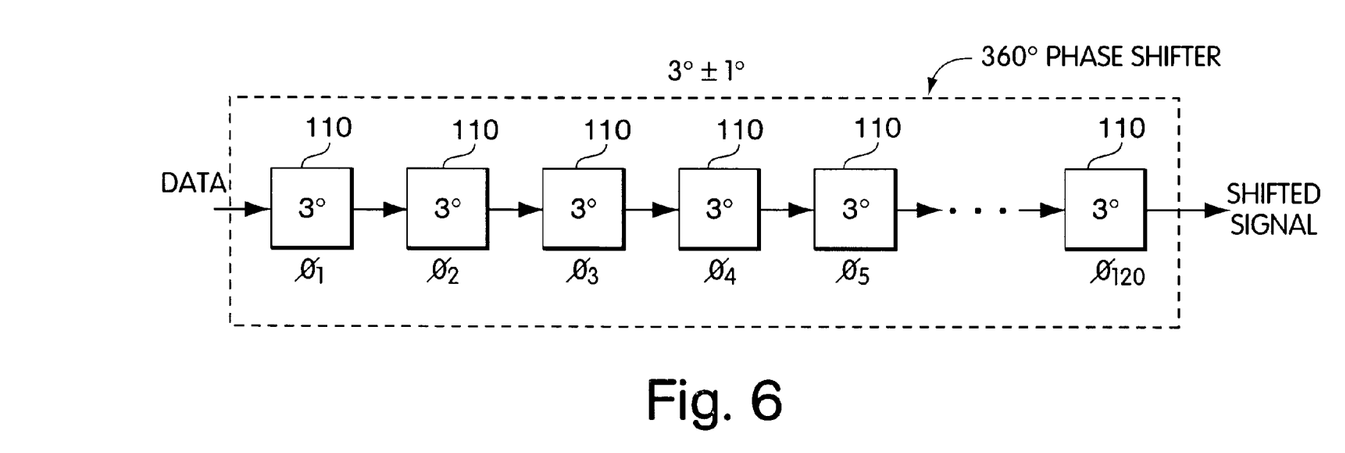
FIG. 6 is a block diagram of a common prior art phase shifter desirable for use in the phase shifting of the data stream of FIG. 5.

Referring to FIG. 6, it is of course possible to provide a large number of phase shifting modules here illustrated at 110 so that the incoming data can be phase shifted through a full 360° at 3° increments.

Figure 7:
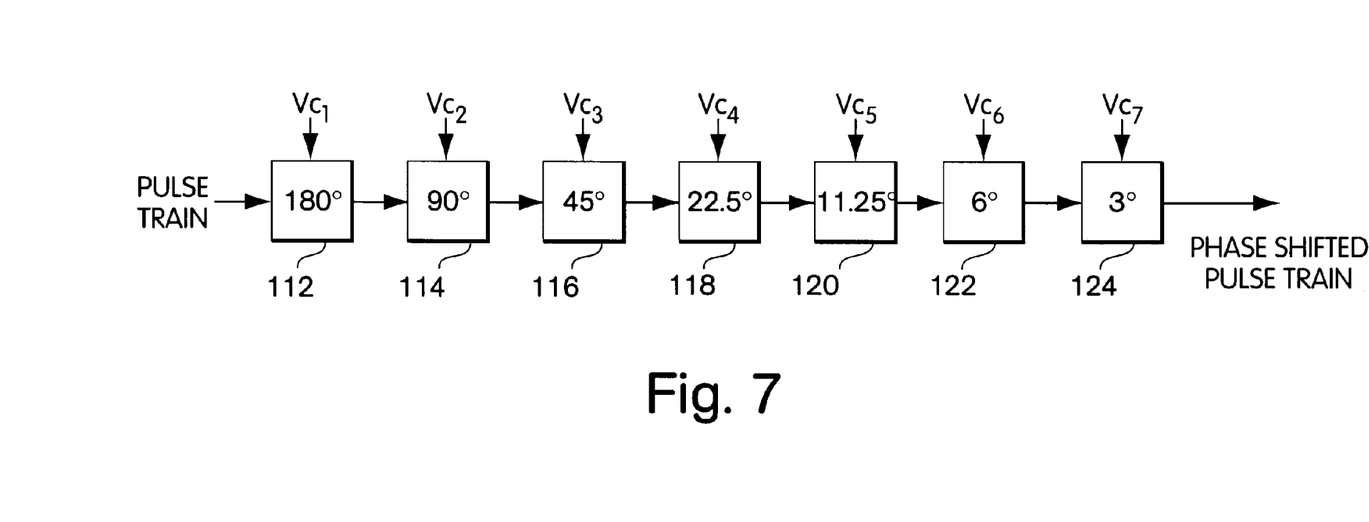
FIG. 7 is a block diagram of a phase shifter in which 360° phase shifting can be achieved in 3° segments with +/−1° accuracy through the utilization of seven different phase shifts.

Rather than providing so many small phase shifts which result in a large number of cascaded modules, as illustrated in FIG. 7 the incoming data pulse train may be shifted in the indicated increments as illustrated at 112–124.

Central to the ability to efficiently provide phase shifting for the high data-rate signal, is the requirement that each of the phase shift modules provide phase shifts of exceedingly precise accuracy.

Figure 8:
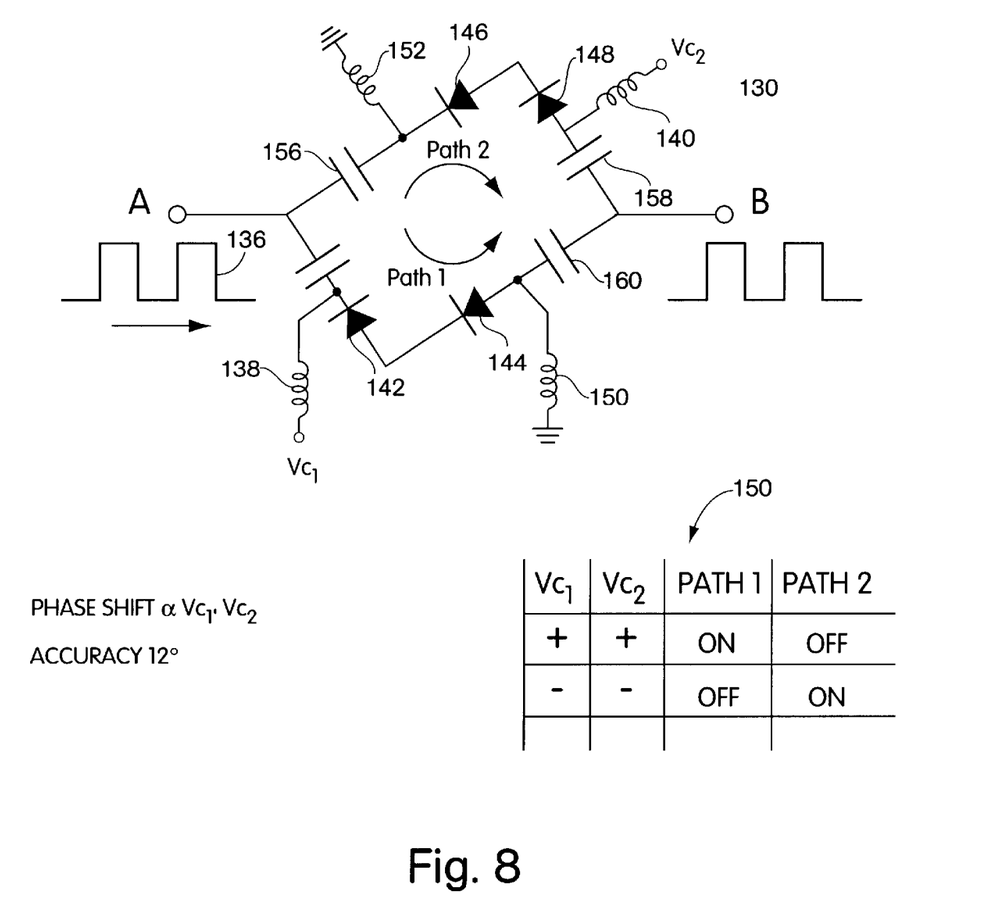
FIG. 8 is a schematic diagram of a prior art phase shifting module in which an incoming data signal is caused to be propagated along one of two paths of differing length so as to provide a phase shifted output, illustrating the utilization of two voltage control signals and two ground paths for each of the two transmission paths of the module.

Referring to FIG. 8, a prior art phase shifting module 130 has two different paths of varying length through it as illustrated as by Path 1 at 132 and Path 2 at 134. The incoming pulse train 136 can be transmitted over Path 1 or Path 2 in accordance with the application of two control voltages here illustrated as $VC_1$ and $VC_2$ through respective inductors 138 and 140. The control voltages are utilized to bias respective diodes 142–144 and 146–148 with the ground return in each case being respectively inductors 150 and 152. As will be appreciated in each of the paths are capacitors 154 and 156 on the inputs and capacitors 158 and 160 on the outputs.

As can be seen by the chart illustrated at 162 for different polarities of the control voltages either Path 1 is turned on or Path 2 is turned on.

As mentioned hereinbefore, when such phase shifting elements or modules is cascaded together to provide the required phase shift, the accuracy obtainable in such a system is less than 12°. This is due primarily to cross talk between the various control voltage leads for each of the phase shifting modules or elements utilized.

Additionally, as described hereinabove, the rise and fall times of the control voltages are not simultaneous when trying to either turn Path 1 or Path 2 on. The result is a critical unpredictability, which significantly degrades the phase shift accuracy.

Figure 9:
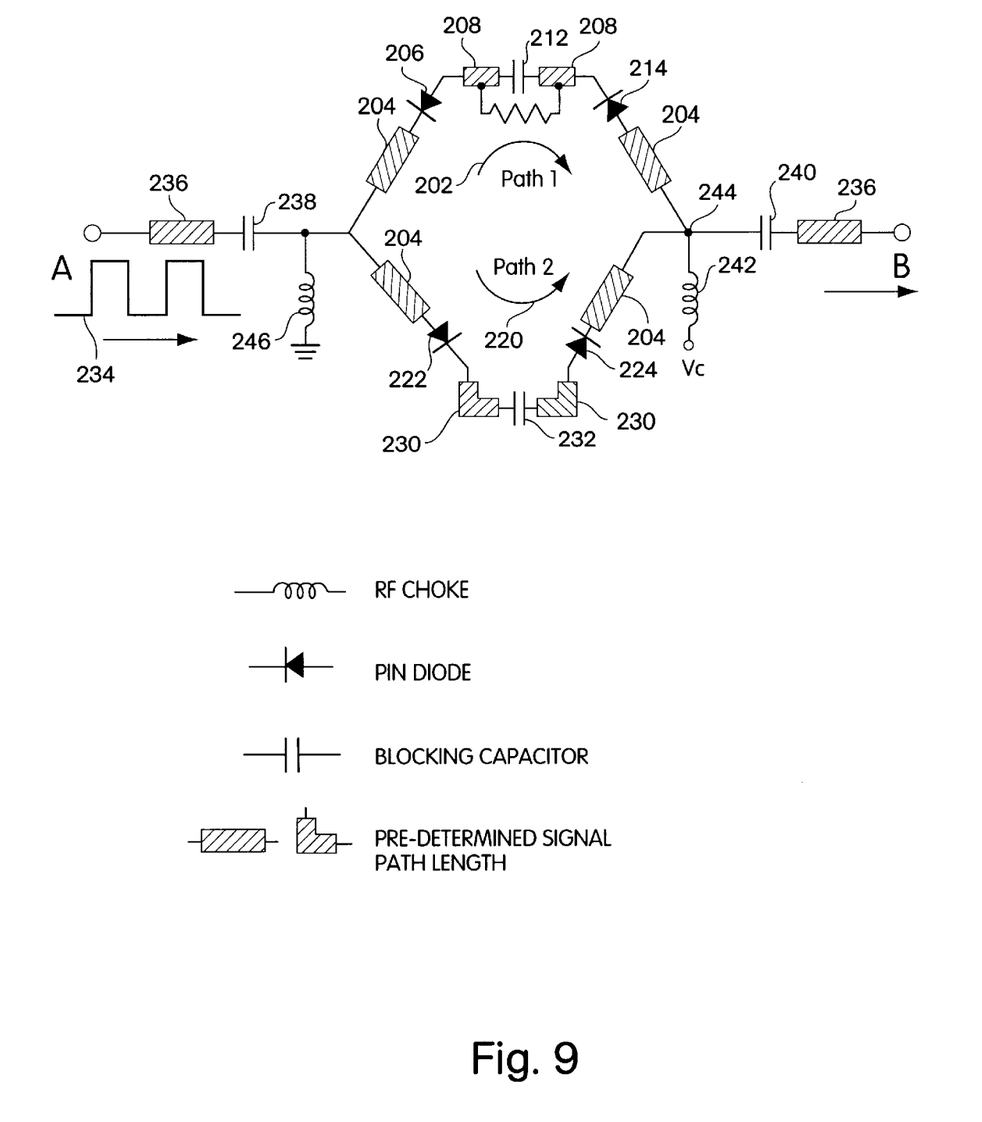
FIG. 9 is a schematic diagram of the subject phase shifting module or element in which only one control voltage is utilized to direct the incoming signal along a first or second path, thus eliminating cross-talk between voltage control leads to the various modules making up the completed phase shifter; and, FIG. 10 is a top view of a phase shifter having a number of phase shifting modules of the type illustrated in FIG. 9.

Referring now to FIG. 9, if the phase shift modules or elements then as can be seen with a first path 202 goes through a predetermined length element 204 through a diode 206, another predetermined element length 208, a capacitor 210 and an identical predetermined element length 208, and then through a diode 214 and a like predetermined element length 204. With resistor 216 connected as illustrated, Path 1 corresponds with a predetermined path length, which is the sum of all the predetermined length elements and therefore corresponds to a predetermined delay and phase shift.

Path 2, here illustrated at 220 includes predetermined path length element 204 in each of the two legs as illustrated, through diodes 222 and 224 and through different predetermined path element lengths illustrated here at 230, with the path including capacitor 232.

It will be noted that the incoming signal or pulse train 234 passes through a predetermined length element 236 and a capacitor 238 and forms the input to the bridge, whereas the output is through capacitor 240 and another predetermined path length element 236.

Control of which path the incoming signal goes along is controlled by a control voltage VC through an inductor 242 to a node 244, with the return path being through inductor 246 to ground.

Figure 10:
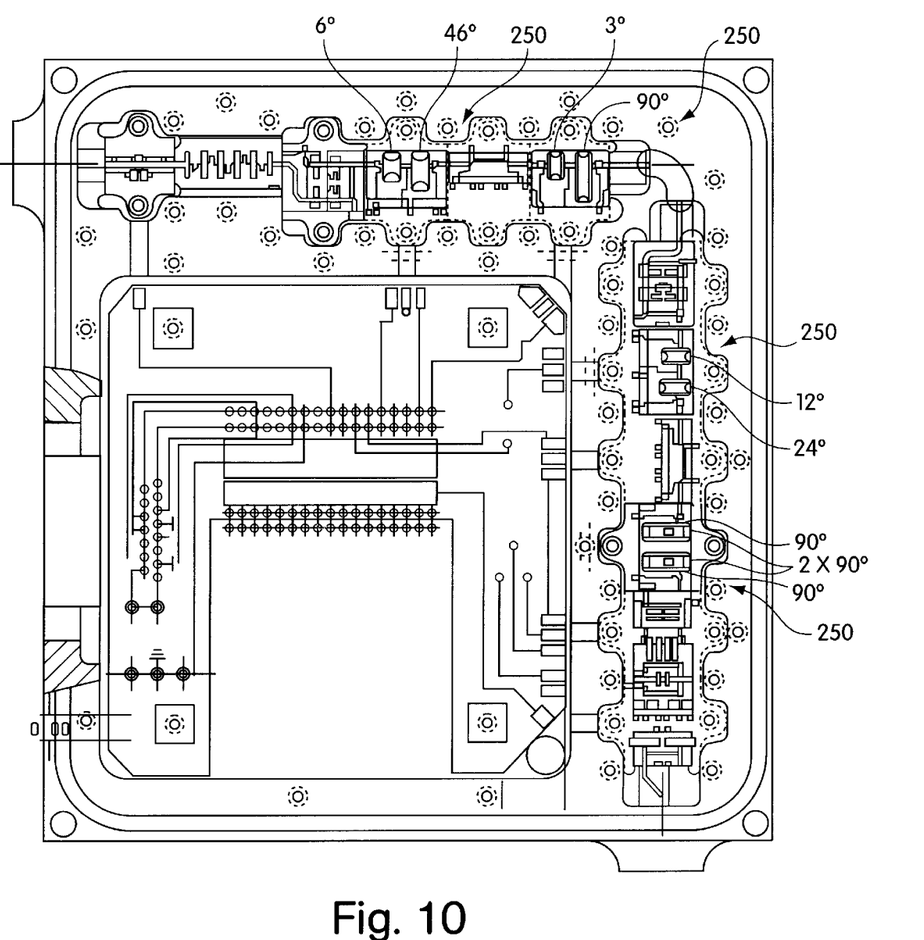

Referring to FIG. 10, what is shown is a top view of a phase shifting unit in which the individual phase shift modules or elements are laid out. As will be seen from FIG. 10, each of the phase shifting modules or elements 250 have internal path links which delay the incoming signal at an input node by respectively 6°, 46°, 3°, 90°, 12° and 24°.

Combinations of these shifts can shift an incoming signal by as much as 180° in 3° increments. If a full 360° capability is required this can be accomplished by multiple 90° phase shifts.

While the phase shifts of FIG. 10 differ from those previously described, it will be appreciated that there are many combinations of cascaded phase shifts can produce the intended result.

In operation, the subject phase shifter operates as a microwave phase shifter using PIN diodes and switching devices to reroute the microwave signal to change its propagation path length, and therefore its propagation delay and phase.

The preferred embodiment utilizes a single control line to carry a bipolar control voltage to switch the signal state, with the control signal being either positive for one signal phase state or negative for the other.

For each of the signal paths in each phase shifting module, there are two PIN diodes and a resistor and a capacitor in its simplest form. Thus each phase shifter comprises two signal paths of different length of a predetermined value or difference. The microwave signals are switched between the two paths to obtain the desired phase shift.

There is one DC blocking capacitor for the input and one for the output, with the control voltage being introduced through an RF choke in one end and returned to ground through an RF choke in the other end.

It is noted that a PIN diode can be completely turned on by forward-biasing it with a forward current of more than 10 mA. The voltage drop across a forward-biased PIN diode is approximately 0.6V. A PIN diode can be completely turned off by reverse-biasing it at more than 2.5V. With the circuit arrangement illustrated, a forward bias of 10 mA is achieved in one path, while more than a reverse 2.5V bias voltage is provided in the other path. When there is a +12V applied to the control line, the PIN diodes on one path are forward-biased, with 10 mA current passing through them. The voltage drops are 0.6V each for both PIN diodes, and 10.8V across the resistor. On the other path, there is a 6V reverse bias for each of the PIN diodes, and a 0V across the resistor since there is no current passing through it. The microwave signal is, of course, propagated on the ON path. For the alternate path, the situation is exactly reversed for a −12V on the control line.

The advantages of the subject system are that the physical arrangement of the control lines is simplified in a microwave system and minimizes the interference of the DC control line to the microwave performance. Moreover, since the control voltage is switched from positive to negative in a single continuous sweep, without complicated crossover control circuits, smooth phase shifting can be achieved without any circuit arrangement.

The result is an exceedingly precise phase shift of 3° resolution with an accuracy of +/−1°. The result is that these phase shift modules, when utilized in a phase shifter can be used to completely eliminate regeneration units in a fiber optic cable network. Working at 6 GHz, the subject phase shifter unit together with the necessary control electronics and connectors can be packed inside a housing of nominal dimensions of 3 inch×3 inch×½ inch.

Having now described a few embodiments of the invention, and some modifications and variations thereto, it should be apparent to those skilled in the art that the foregoing is merely illustrative and not limiting, having been presented by the way of example only. Numerous modifications and other embodiments are within the scope of one of ordinary skill in the art and are contemplated as falling within the scope of the invention as limited only by the appended claims and equivalents thereto.

What is claimed is:

1. In a fiber optic long haul network for transmitting high speed data streams along with a clock pulse stream, a method for minimizing the necessity for regeneration to recover the data comprising the steps of:

interposing an RF phase shifter in the network having the ability to phase shift the data steam in predetermined increments with an accuracy of ±1°, said phase shifter having cascaded elements and only one bias voltage to switch a path between one delay and another within an element, the use of a single bias voltage permitting said ±1° accuracy; and, adjusting the phase shifter to phase shift the incoming data stream to align the pulses of the data stream with a recovered clock pulse stream, whereby the accuracy of the phase shift permits recovery of a data stream transmitted over long haul distances without the necessity of regeneration.

2. The method of claim 1, wherein the predermined increments are such as to be able to phase shift the data stream from 0° to 360°.

3. The method of claim 1, wherein the phase shifter includes a number of cascaded phase shifting elements, each phase shifting element having two branches of differing length for delaying an input signal thereto, and a switching circuit for each of the phase shifting elements for determining which of the two paths the input signal thereto will follow.

4. The method of claim 3, wherein the switching circuit operates by the application of a bias voltage applied over only two voltage control leads.

* * * * *